United States Patent [19]

Gerard et al.

[11] 4,171,162
[45] Oct. 16, 1979

[54] SYSTEM FOR POSITIONING AN OBJECT IN AN OPTICAL PROJECTION SYSTEM

[75] Inventors: René Gerard; Michel Lacombat, both of Paris, France

[73] Assignee: Thomson-CSF, Paris, France

[21] Appl. No.: 897,166

[22] Filed: Apr. 17, 1978

[30] Foreign Application Priority Data

Apr. 20, 1977 [FR] France .................. 77 11911

[51] Int. Cl.$^2$ .................. G01B 11/00; H01L 21/68
[52] U.S. Cl. .................. 356/401; 356/150; 356/400
[58] Field of Search .......... 356/138, 150, 152, 153, 356/154, 399, 400, 401; 355/53, 78, 86, 95

[56] References Cited

U.S. PATENT DOCUMENTS

| | | | |
|---|---|---|---|
| 4,052,603 | 10/1977 | Karlson | 356/400 |
| 4,054,386 | 10/1977 | Suzuki | 356/153 |

OTHER PUBLICATIONS

Khoury et al., "Alignment System for Projection Mask," *IBM Technical Disclosure Bulletin*, vol. 13, No. 3, Aug. 1970, pp. 768–769.

Harper et al., "Aligning and Inspecting Microelectronic Circuits," *IBM Technical Disclosure Bulletin*, vol. 13, No. 4, Sep. 1970, pp. 1028–1029.

*Primary Examiner*—John K. Corbin
*Assistant Examiner*—R. A. Rosenberger
*Attorney, Agent, or Firm*—Cushman, Darby & Cushman

[57] ABSTRACT

The invention relates to the positioning of an object comprising at least two fixed reference marks in an optical projection system. The system according to the invention comprises two projector arms illuminating two regions of the surface of the object through two marks, which form a reference system, having a variable inter-axis interval, display means enabling coincidence between the reference marks of the object and the reference system to be established.

5 Claims, 2 Drawing Figures

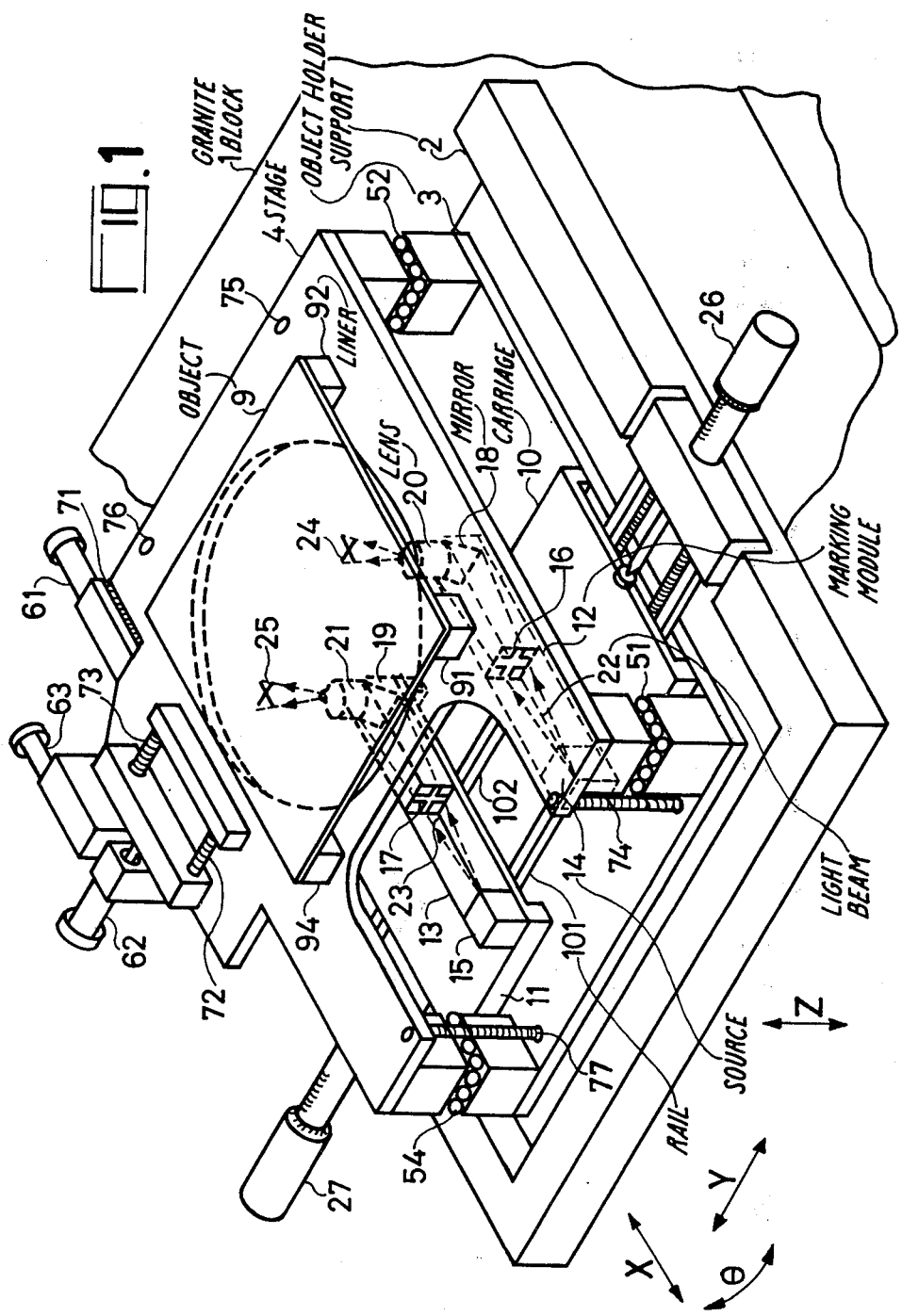

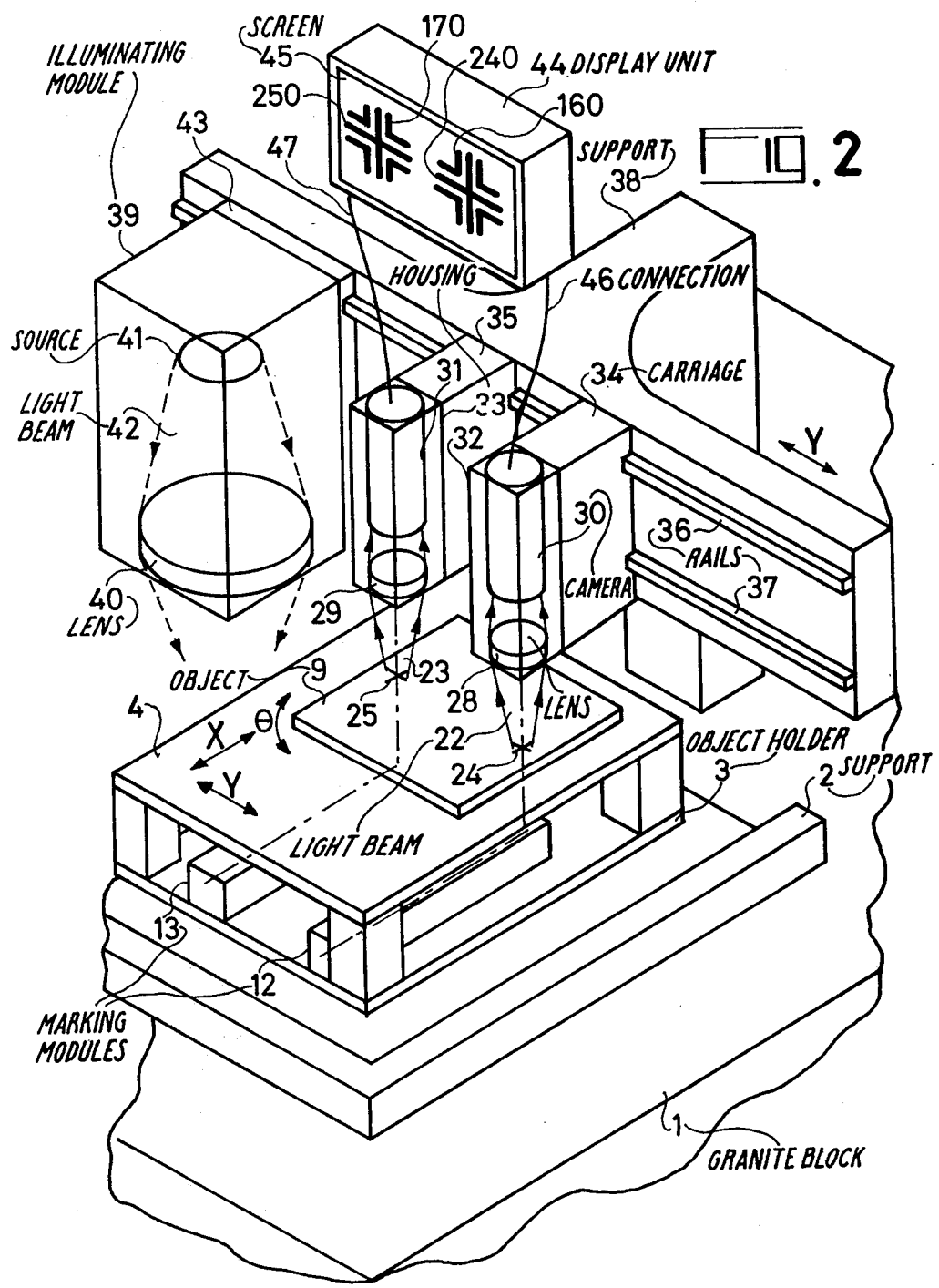

SYSTEM FOR POSITIONING AN OBJECT IN AN OPTICAL PROJECTION SYSTEM

This invention relates to the positioning of an object, of which the surface is provided with marks, in an optical pattern projection system, particularly a photorepeater.

One of the phases involved in the production of components by masking techniques consists in transferring several identical patterns onto a plate in an arrangement of lines and columns. To this end, it is possible to use a photorepeater comprising in particular a light source and a lens enabling the image of an object, of which the non-uniform transparency characterises the pattern to be transferred, to be projected onto the plate, of which the surface is photosensitive, with a magnification of less than 1. The plate is integral with a table comprising step by step displacement means enabling any zone of the plate to be exposed in order to obtain the required arrangement. The plate thus exposed may form a mask intended for transfer onto substrates without any change of scale. Or, it may itself form the substrate. In this case, a superposition of levels is obtained by subjecting the plate to a succession of pattern transfer operations and chemical treatments.

Irrespective of the type of material to be exposed, the present invention seeks to solve the problem of positioning the object in the photorepeater with considerable accuracy. Indeed, once the plate has been accurately positioned relative to its supporting table, the supporting table may be displaced along two perpendicular directions. Accordingly, the repeated patterns are aligned relative to those directions. In order to avoid the so-called "crab" effect, i.e. to ensure that the orientation of the patterns, which are generally comprised in a square, is correct, it is necessary for one of the axis of the object to be strictly parallel to one of the displacement directions. Generally, this axis is represented by two reference marks recorded on the object outside the pattern. In addition, several objects are generally used during a same transfer operation, one of these objects carrying the principal pattern which characterises the circuit to be reproduced and the others carrying particular patterns intended to be transferred onto certain zones of the plate in order to form reference points thereon. To ensure that these various patterns are correctly aligned on the plate, the various objects have to be positioned relative to a common reference system.

This reference system is usually formed by two reference marks integral with the photorepeater and situated on an axis which is adjusted parallel to one of the displacement directions of the table supporting the plate. This adjustment takes place during production of the photorepeater. In known photorepeaters, alignment of the object relative to the reference system is obtained by mechanical means or by optical means. One of the known processes consists in illuminating the reference marks recorded on the object by two light sources; the light is then reflected by mirrors towards reference marks forming the reference system of the photorepeater and the coincidences observed by means of a double lens microscope. The 2 reference marks integral with the photorepeater are fixed and their inter-axis interval is such that it corresponds to the inter-axis interval between the reference marks of the objects which are desired to be used. In this case, however, the photorepeater can only be adapted to one object size.

In order to increase the accuracy of alignment and to bring the possibility of matching the reference system with any object size, the present invention makes use of two marking modules which comprise projection means for projecting 2 reference marks onto the object. These marking modules can be displaced in one direction for the adjustment of the inter-axis of the 2 reference marks. The alignment of the object is obtained when there is a coincidence between the reference marks recorded on the object and the reference marks imaged in the plane of the object by the projection means.

In accordance with the present invention, there is provided a system for positioning an object in an optical system for projecting at least one pattern onto a plate, the surface of said object having a non-uniform transparency forming said pattern and at least a first pair of reference marks; said system comprising an object holder, a stage being kept integral with said object, first displacement means for displacing said stage in its plane relative to said object holder, two projector arms enabling two regions of said object to be illuminated through a second pair of reference marks, second displacement means for controlling the spacing of said two projector arms and display means collecting the light emerging from said two regions and providing an image of said regions; said second pair of reference marks forming a reference system having a variable inter-axis interval and being fixed in its orientation relative to said object holder, said first and second displacement means enabling coincidence to be established between the images of said first and second pairs of reference marks provided by said display means.

For a better understanding of the present invention, and to show how the same may be carried into effect, reference will be made to the ensuing description and the following figures among which:

FIG. 1 is a view of the upper part of the object holder and the marking modules;

FIG. 2 is a general view of the system according to the invention.

The system according to the invention will be described in reference with a photorepeater enabling the image of an object to be projected onto a photosensitive plate by means of a lens. In one embodiment, this photorepeater comprises a lower granite block forming a first horizontal reference plane, which supports a plate table, and an upper granite block, forming another reference plane adjusted parallel to the first one. A lens holder supporting the lens and an object holder supporting the object are connected to a support fixed on the upper block.

FIG. 1 is a view of the upper part of the support 2 fixed on the upper block 1, partially represented. The support 2 may assume any form but, like the block 1, has to be hollowed at its centre in order to give a passage for the light beam by which the plate is exposed through the object. An object holder 3 is connected to the support either by a fixed mechanical connection or by a guide system which allows it a degree of freedom: a displacement along a vertical axis Z, in order to adjust the magnification. The lens holder, situated below the object holder, is not represented. The object holder 3 is a flat ground surface which is also hollowed at its centre. Above the object holder there is a second flat ground surface, a stage 4 which can be displaced in its plane relative to the object holder 3 by means of four ball assemblies 51 to 54 (the assembly 53 is hid on the Figure). The movements are controlled by three screws 61, 62 and 63 which provide for movement along two perpendicular directions X and Y and for an angle of rotation θ in the plane XY. Three reaction springs 71 to 73 respectively associated with the screws 61 to 63 and four springs 74 to 77 (the springs 75 and 76 are hid) connecting the stage 4 and the object holder 3 may be provided to keep the stage in its plane and in the position selected. The object 9 is placed above a hollowed zone of the stage 4. It rests on four liners 91 to 94 which enable it to be positioned strictly parallel to the plate to be exposed.

In addition to the stage 4, the object holder 3 supports two marking modules 12 and 13. The two modules are respectively integral with two carriages 10 and 11 arranged to run along two parallel rails 101 and 102. These rails are fixed to the object holder 3 during the production of the photorepeater. Their direction parallel to Y forms a mechanical reference bound to the support 2. The position of the support 2 is adjusted during production of the photorepeater in such a way that this direction Y is parallel to one of the displacement directions of the plate-table. Each marking module is formed by a source (14 and 15) emitting a light beam (22 and 23) of which the axis is parallel to X and which illuminates a reference mark (16 and 17). A mirror (18 and 19) enables the light beam to be reflected in a direction parallel to the axis Z perpendicular to the plane XY. A lens (20 and 21) establishes the optical conjugation between the plane of the reference marks 16 and 17 and the plane of the object. When the object is well positioned, the light beams 22 and 23 illuminate two reference marks 24 and 25 in the form of a cross. The configuration of the marks 16 and 17 and the magnification of the lenses 20 and 21 is such that the reference marks 24 and 25 can be centred relative to the images of the marks 16 and 17. During the positioning of the first object for a given transfer operation, the modules 12 and 13 are respectively brought into operation by two micrometric adjustment screws 26 and 27. By means of these two screws, the distance between the carriages 10 and 11 can be adjusted to that it is possible to adjust the inter-axis interval of the marks 16 and 17 in dependence upon the inter-axis interval of the reference marks of the object 24 and 25. During the positioning of the following objects corresponding to the same transfer operation, the modules 12 and 13 must not be displaced because they form the reference system in relation to which it is possible to position the objects intended to be successively transferred onto the same sample for forming a correct arrangement of the various patterns.

In every case, the object is positioned manually in relation with the reference system formed by the marks 16 and 17 by means of the screws 61, 62 and 63. In a realisation of the invention, the maximum displacements of the object are ±1.5 mm. The inter-axis interval of the reference marks 16 and 17 may be adjusted from 20 to 120 mm, so that it may be adapted to any object format.

FIG. 2 is a general view of the system according to the invention and, in particular, of the display means by which it is possible to view the coincidence or non-coincidence of the reference marks 16 and 17 relative to the reference marks 24 and 25, respectively. The light beams 22 and 23 emerging from the surface of the object after having passed through lenses 28 and 29 are received by cameras 30 and 31. The lenses and the cameras are contained in housings 32 and 33 integral with carriages 34 and 35. The carriages may be moved under manual control in the direction Y along rails 36 and 37 fixed to a support 38 which is itself fixed to the upper block 1. This possibility of displacement provides on one hand for the positioning of the housings 32 and 33 in such a way that the cameras 30 and 31 effectively collect the beams 22 and 23, irrespective of the position of the marking modules 12 and 13 and their spacing. On the other hand, on completion of alignment, the housings 32 and 33 are put out of the range of the object, so that it is possible to position an illuminating module 39 integral with a carriage 43 and comprising a lens 40 for condensing a beam 42 issuing from a light source 41. This beam 42 is intended to insole the plate through the object which forms a mask. The images of the various reference marks projected to the cameras are observed on a screen 45 by means of a display unit 44 linked to the cameras by connections 46 and 47. FIG. 2 shows the images 160 and 170 of the marks 16 and 17 and the images 240 and 250 of the reference marks 24 and 25 obtained after adjustment. The object of the adjustment is to obtain the superposition of the images 160 and 240, and 170 to 250 by acting on the marking modules 12 and 13 by screws 26 and 27 and/or on the stage 4 of the object 9 by the screws 61, 62 and 63, as mentioned above. Means are provided in the unit 44 for obtaining on the screen images of suitable dimensions for viewing, but situated in adjacent fields, the real distance between the reference marks (typically from 20 to 120 mm) being in reality very large by comparison with the size of the reference marks. In order to benefit from the superposition, it is best to centre the images of the reference marks of the object relative to the images of the reference marks of the marking modules. In one embodiment of the invention, the object was aligned with an accuracy of ±0.5 μm, the thickness of the lines forming the reference marks of the object being 15 μm to be centred in gaps of 20 μm.

What we claim is:

1. A system for positioning an object in an optical system for projecting at least one pattern onto a plate, the surface of said object having a non-uniform transparency forming said pattern and at least a first pair of reference marks; said system comprising an object holder, a stage being kept integral with said object, first displacement means for displacing said stage in its plane relative to said object holder, two projector arms enabling two regions of said object to be illuminated through a second pair of reference marks, second displacement means for controlling the spacing of said two projector arms and display means collecting the light emerging from said two regions and providing an image of said regions; said second pair of reference marks forming a reference system having a variable inter-axis interval and being fixed in its orientation relative to said object holder, said first and second displacement means enabling coincidence to be established between the images of said first and second pairs of reference marks provided by said display means.

2. A system as claimed in claim 1, wherein each projector arm comprises a light source, a transparent plate on which is recorded one of the two reference marks of said second pair, and optical means for forming an image of said plate in the plane of said object with a magnification of less than 1; the reference marks of said second pair having a configuration respectively adapted to the reference marks of first pair.

3. A system as claimed in claim 1, wherein said display means comprise two cameras respectively arranged to collect the light emerging from said two regions.

4. A system as claimed in claim 3, wherein said display means further comprise a screen and means for bringing the images of said first and second pairs of reference marks onto said screen in adjacent fields.

5. A system as claimed in claim 1, wherein said plate is positioned by reference to two fixed axis, the orientation of said reference system being parallel to one of said two fixed axis.

* * * * *